(12) United States Patent
Wilson et al.

(10) Patent No.: US 9,665,139 B2
(45) Date of Patent: May 30, 2017

(54) COOLING SYSTEM FOR A COMPUTER AND METHOD FOR ASSEMBLING THE SAME

(75) Inventors: John Alexander Wilson, San Francisco, CA (US); Robert Haden Garrett, San Francisco, CA (US)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 0 days.

(21) Appl. No.: 14/411,987

(22) PCT Filed: Aug. 27, 2012

(86) PCT No.: PCT/US2012/052424
§ 371 (c)(1),
(2), (4) Date: Dec. 30, 2014

(87) PCT Pub. No.: WO2014/035362
PCT Pub. Date: Mar. 6, 2014

(65) Prior Publication Data
US 2015/0170993 A1    Jun. 18, 2015

(51) Int. Cl.
*G06F 1/20* (2006.01)
*H01L 23/427* (2006.01)
(Continued)

(52) U.S. Cl.
CPC .............. *G06F 1/203* (2013.01); *B23P 15/26* (2013.01); *G06F 1/1613* (2013.01); *G06F 1/20* (2013.01);
(Continued)

(58) Field of Classification Search
CPC .......... H01L 23/427; H01L 2924/0002; B23P 15/26; G06F 1/20; G06F 1/203; Y10T 29/4935; H05K 7/20336
(Continued)

(56) References Cited

U.S. PATENT DOCUMENTS 5,986,882 A   11/1999  Ekrot et al.
6,122,167 A *  9/2000  Smith ..................... G06F 1/182
                                                    257/E23.088
(Continued)

FOREIGN PATENT DOCUMENTS

EP   1591872 A2   11/2005
JP   2004320021   11/2014
(Continued)

OTHER PUBLICATIONS

AU Examination Report dated Feb. 13, 2015, Australian Patent Application No. 2012388764, 4 pages.
(Continued)

*Primary Examiner* — Zachary M Pape
(74) *Attorney, Agent, or Firm* — Polsinelli PC

(57) ABSTRACT

According to various embodiments, a computer system may be provided. The computer system may include: a housing with a protrusion; a heat generating device; a heat exchanger; and a heat pipe configured to transfer heat from a first end of the heat pipe to a second end of the heat pipe. The first end of the heat pipe may be coupled to the heat generating device. The second end of the heat pipe may be coupled to the heat exchanger. The second end of the heat pipe may be arranged in the protrusion of the housing.

14 Claims, 6 Drawing Sheets

(51) Int. Cl.
*G06F 1/16* (2006.01)
*B23P 15/26* (2006.01)

(52) U.S. Cl.
CPC .... *H01L 23/427* (2013.01); *H01L 2924/0002* (2013.01); *Y10T 29/4935* (2015.01)

(58) Field of Classification Search
USPC ..... 361/700, 679.47, 679.52; 165/80.4–80.5, 165/104.33; 257/715; 174/15.2, 547, 174/548
See application file for complete search history.

(56) References Cited

U.S. PATENT DOCUMENTS

| | | | |
|---|---|---|---|
| 6,141,215 | A | 10/2000 | Podwalny et al. |
| 6,181,553 | B1 | 1/2001 | Cipolla et al. |
| 6,266,241 | B1 | 7/2001 | Van Brocklin et al. |
| 6,288,895 | B1 | 9/2001 | Bhatia |
| 6,352,103 | B1 | 3/2002 | Chu et al. |
| 6,353,536 | B1 | 3/2002 | Nakamura et al. |
| 7,969,730 | B1 | 6/2011 | Doherty et al. |
| 2004/0001316 | A1 | 1/2004 | Kamikawa et al. |
| 2005/0145371 | A1 | 7/2005 | DiStefano et al. |
| 2005/0243511 | A1 | 11/2005 | Hata et al. |
| 2007/0068659 | A1 | 3/2007 | Hwang |
| 2008/0002357 | A1 | 1/2008 | Makley |
| 2010/0220439 | A1 | 9/2010 | Qin |
| 2011/0292605 | A1 | 12/2011 | Chen |
| 2013/0083253 | A1* | 4/2013 | Maeshima ............... H04N 5/64 348/739 |

FOREIGN PATENT DOCUMENTS

| | | |
|---|---|---|
| TW | 200714190 A | 4/2007 |
| WO | 2010110779 A1 | 9/2010 |

OTHER PUBLICATIONS

Preliminary Report on Patentability mailed Mar. 3, 2015; in PCT patent application No. PCT/US2012/052424.
Extended European Search Report issued Dec. 17, 2015 in European Patent Application No. 12883668.1, 9 pages.
First Office Action mailed on May 9, 2016 in corresponding Taiwan Patent Application No. 102119328.

* cited by examiner 1102   1104   1106

1202   1204   1206

COOLING SYSTEM FOR A COMPUTER AND METHOD FOR ASSEMBLING THE SAME

TECHNICAL FIELD

Various embodiments generally relate to computer systems, parts of a housing for a computer system, heat exchangers, and methods for assembling parts of a computer system.

BACKGROUND

Mobile computer systems such as laptop computers or notebook computers may be designed to be as portable as possible. Thus, there may be the need for thin mobile computer systems.

SUMMARY OF THE INVENTION

According to various embodiments, a computer system may be provided. The computer system may include: a housing with a protrusion; a heat generating device; a heat exchanger; and a heat pipe configured to transfer heat from a first end of the heat pipe to a second end of the heat pipe. The first end of the heat pipe may be coupled to the heat generating device. The second end of the heat pipe may be coupled to the heat exchanger. The second end of the heat pipe may be arranged in the protrusion of the housing.

According to various embodiments, a part of a housing for a computer system may be provided. The part may include a protrusion configured to hold one end of a heat pipe of the computer system.

According to various embodiments, a heat exchanger for connecting to a heat pipe may be provided. The heat exchanger may include a plurality of fins. The fins may have an at least generally rectangular shape.

According to various embodiments, a method for assembling parts of a computer system may be provided. The method may include providing one end of a heat exchanger of the computer system in a protrusion of a housing of the computer system.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. The dimensions of the various features or elements may be arbitrarily expanded or reduced for clarity. In the following description, various embodiments of the invention are described with reference to the following drawings, in which.

DETAILED DESCRIPTION

Figure 1:
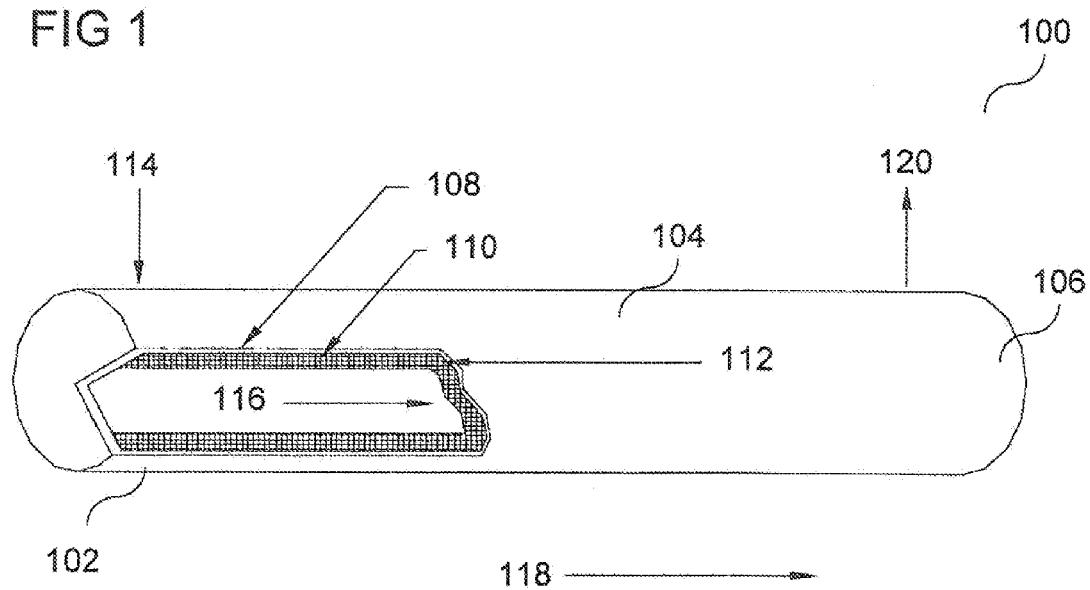
FIG. 1 shows a heat pipe.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

Various embodiments are provided for devices, and various embodiments are provided for methods. It will be understood that basic properties of the devices also hold for the methods and vice versa. Therefore, for sake of brevity, duplicate description of such properties may be omitted.

It will be understood that any property described herein for a specific device may also hold for any device described herein. It will be understood that any property described herein for a specific method may also hold for any method described herein. Furthermore, it will be understand that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed or attached, or just in contact without any fixation, and it will be understood that both direct coupling or indirect coupling (in other words: coupling without direct contact) may be provided.

According to various embodiments, devices and methods may be provided to improve notebook computer cooling system efficiency without increasing the apparent unit thickness.

Form factors of systems devices such as notebook computers and handhelds continue to shrink. The X & Y (width and depth) of a notebook computer may usually be driven by the display size, so the dimension over which system designers may have the most impact may be in Z (thickness). Constant innovation may be required to be able to dispel large amounts of thermal energy in ever thinner enclosures.

Most high power notebooks may use a heat pipe (HP; or heatpipe) to transfer (or transport) heat efficiently away from the hottest chip. Heat may be removed from the HP by a heat exchanger that may transfer the heat to air that is forced through the heat exchanger (HTx) by a blower. Two ways to increase the efficiency of the cooling system may be to reduce the resistance to air flowing through the heat exchanger or to increase the surface area of the HTx fins.

According to various embodiments, the efficiency of a notebook computer cooling system may be increased by improving airflow through, and increasing the surface area of, its heat exchanger without increasing apparent thickness of the notebook.

FIG. 1 shows a heat pipe 100. The heat pipe 100 may be a thermal linkage of very high thermal conductivity. It may be a closed, evacuated chamber with a shell 108 and lined with a wick 110. Heat may be transported (or transferred) by evaporation of a volatile fluid, which may be condensed at a cold end (or condenser end) 106 of the pipe and returned by capillary action to a hot end (or evaporator end) 102 like indicated by an arrow 112. The vapor may pass through the cavity like indicated by an arrow 116. Heat pipes may include three zones: the evaporator 102, the condenser 106 and an adiabatic section 104 connecting the two. This device may have many times the heat transfer capacity of the best heat-conducting materials. Heat may be put in at 114 to the heat pipe, and put out at 120, so that the heat may flow like indicated by an arrow 118.

Figure 2:
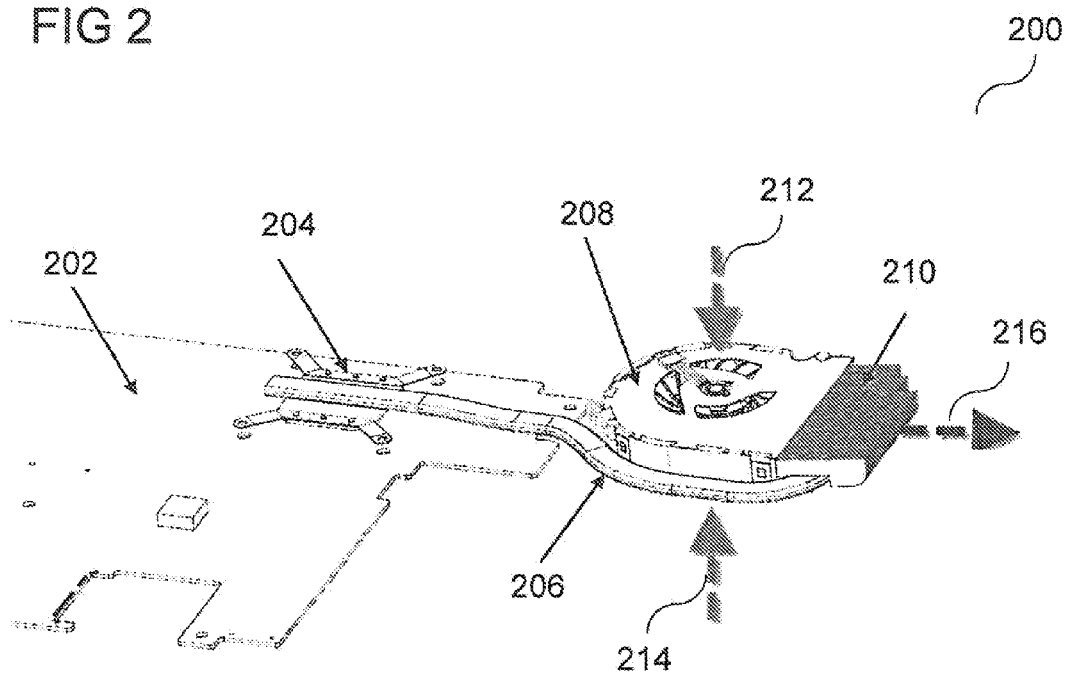
FIG. 2 shows a computer cooling system.

FIG. 2 shows a computer cooling system 200, for example a notebook computer cooling system. In notebook computer cooling applications, the evaporator end of a HP 206 may be attached to a heat producing component (for example a CPU (central processing unit) and/or GPU (graphics processing unit) provided on a PCB (printed circuit board) 202) through a heat transfer plate 204, which may be in intimate contact with the component and the HP. Heat may be transferred through the heat pipe and dissipated on the condensing end through a heat exchanger (HTx) 210. An HTx may include or may consist of a plurality of fins attached to the condensing end of the HP 206. A blower 208 or fan may be used to force air through the heat exchanger 210. Heat from the system may be transferred to the air input by cool air inlets 212 and 214, and blown out of the system through a hot air outlet 216.

Figure 3:
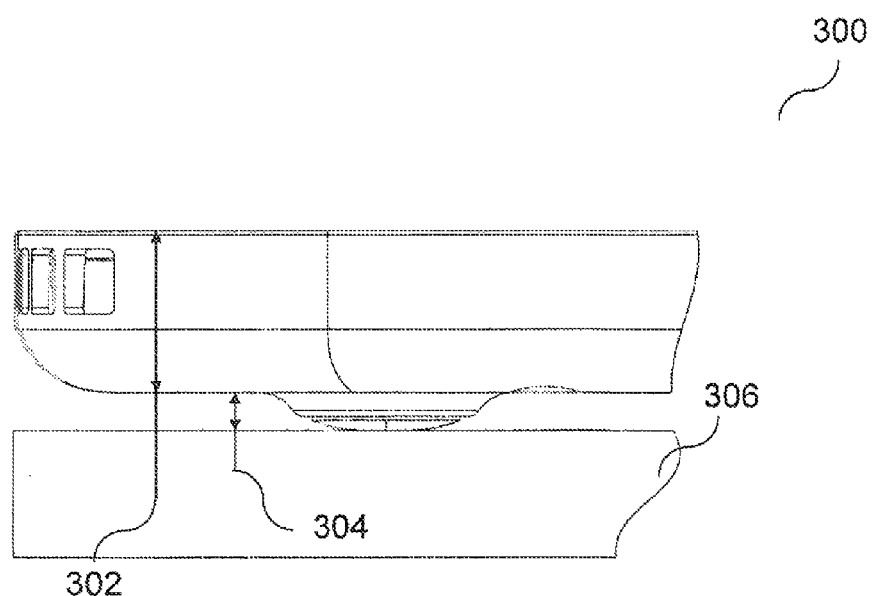
FIG. 3 shows a cross-sectional view of a computer system.

FIG. 3 shows a cross-sectional view 300 of a computer system (or in other words: computing system). It may be common practice in the industry to specify the apparent thickness 302 of a notebook computer, which is the distance between major upper and lower surfaces of the computer, not including any local projections from the major surfaces, such as feet (the height of a foot 304 is shown in FIG. 3 with reference to a surface on which the computer system stands, for example a desk 306). In order to provide a gap for air to flow under the computer and into the cooling system blower, it may also be common for notebook computers to have feet that project several millimeters from the major surface. According to various embodiments, this projection may be used to improve the efficiency of the cooling system.

For a device such as a notebook computer, the size of the heat exchanger may be driven by physical constraints of the housing. Typically, there may be some height available for the heat exchanger which may be filled with heat exchanger fins. The open area through the fins may be restricted by the heat pipe which may be desired to extend along the length of the heat exchanger and make contact to each fin. Since the heat pipe may occupy some percentage of the open fin area of the heat exchanger, airflow through the heat exchanger may be reduced.

Figure 4:
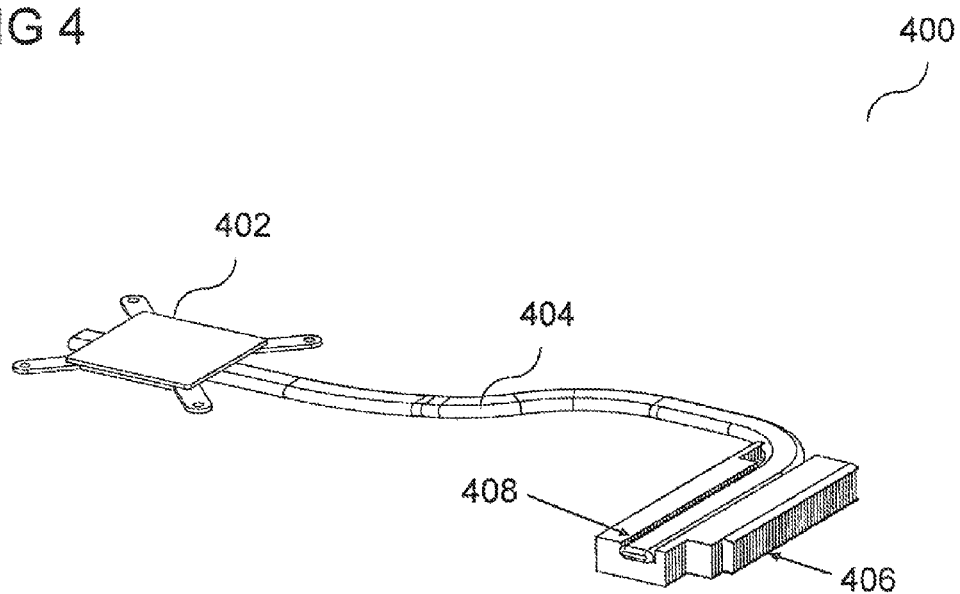
FIG. 4 shows a heat pipe assembly.

FIG. 4 shows a heat pipe assembly 400. A heat generating device 402 may be coupled to a first end of the heat pipe 404 (for example using a heat transfer plate). A second end of the heat pipe 404 may be coupled to a heat exchanger 406. Like indicated by arrow 408, the heat pipe 404 may be buried in the heat exchanger fins. This may restrict the air flow through the fins, which may decrease efficiency.

Figure 5:
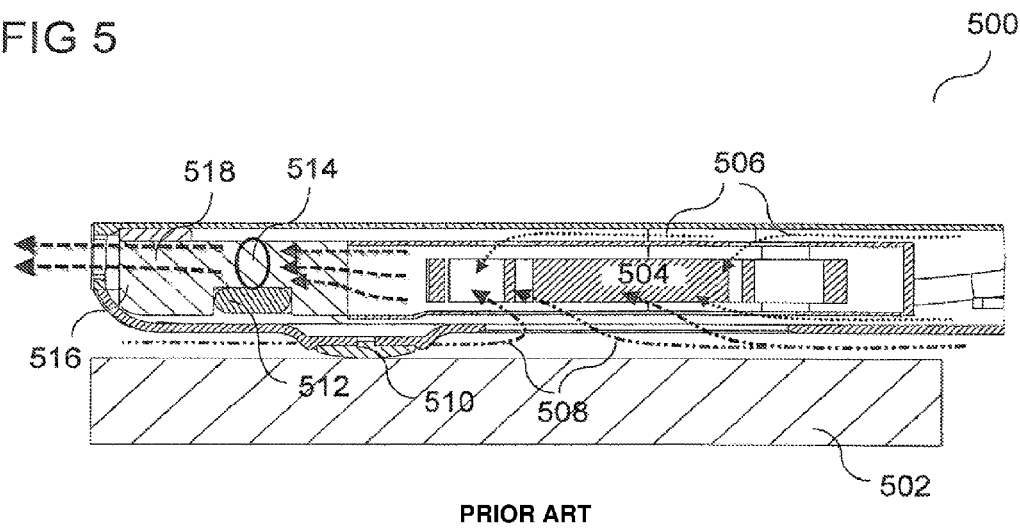
FIG. 5 shows a cross-sectional view of a cooling system.

FIG. 5 shows a cross-sectional view 500 of a cooling system known in the industry. The cross-section through a blower 504 (for example including fan blades) and heat exchanger fins 516 of the cooling system may show the airflow restriction caused by a heat pipe 512 being buried in the heat exchanger fin area. The computer system may stand on a surface, for example a desktop 502. Cool air may be drawn in by the blower 504 through vents in the bottom housing, like indicated by dashed-and-dotted arrows 508. Warm air may be drawn by the blower 504 from inside, like indicated by dotted arrows 506. The housing may cool components that are not attached to the heat pipe. A foot 510 may provide a gap between the table (or desktop 502) and the bottom housing for air flow to flow through the bottom vents. The heat pipe 512 may be brazed to heat exchanger fins. As shown by ellipsoid 514, flow restriction due to the heat pipe 512 being buried inside the heat exchanger (or heat exchanger fins 516) may occur. Like indicated by dashed arrows 518, the heat exchanger may transfer heat from the fins 516 to the air. The hot air may then be expelled from the system. As described, air flow through the heat exchanger may be reduced due to the fact that the heat pipe 512 resides in the same volume as the heat exchanger.

Figure 6:
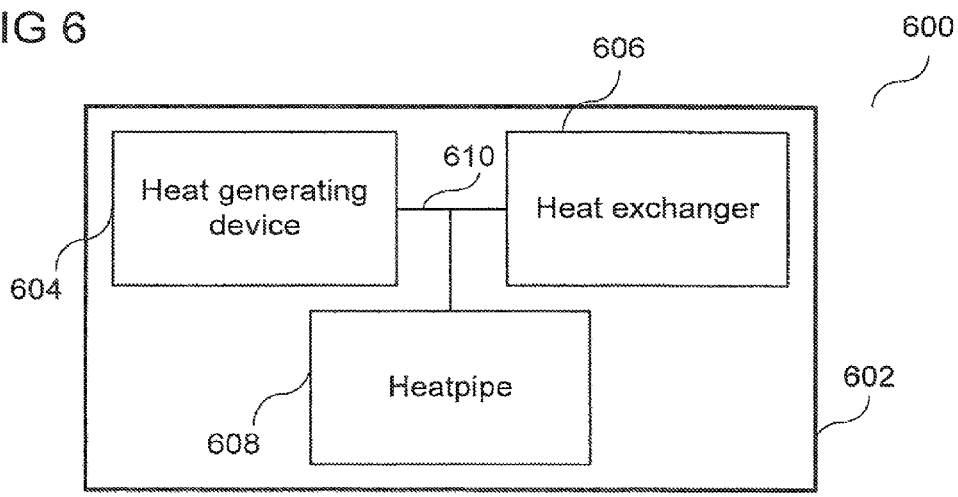
FIG. 6 shows a computer system in accordance with an embodiment.

FIG. 6 shows a computer system 600 in accordance with an embodiment. The computer system may include a housing 602 with a protrusion. The computer system 600 may further include a heat generating device 604. The computer system 600 may further include a heat exchanger 606. The computer system 600 may further include a heat pipe 608 configured to transfer heat from a first end of the heat pipe 608 to a second end of the heat pipe 608. The first end of the heat pipe 608 may be coupled to the heat generating device 604, and the second end of the heat pipe 608 may be coupled to the heat exchanger 606. The coupling is indicated in FIG. 6 by lines 610, and may be provided for example by heat transfer plates or by heat transfer paste. The second end of the heat pipe 608 may be arranged in the protrusion of the housing 602.

According to various embodiments, the protrusion may include or may be or may be included in a part of a foot of the housing 602 of the computer system 600.

According to various embodiments, the foot may provide a distance of a main surface of a lower part of the housing 602 and a surface on which the computer system 600 stands (for example a desk, if the computer system stands on the desk).

According to various embodiments, the heat generating device 604 may include or may be or may be included in a central processing unit and/or a graphics processing unit.

According to various embodiments, the heat exchanger 606 may include or may be a plurality of fins. The fins may have an at least generally rectangular shape.

According to various embodiments, the computer system 600 may further include a blower (not shown in FIG. 6) configured to blow air through the heat exchanger 606.

According to various embodiments, the dimensions of the protrusion may be in the range of about 1 to 6 mm (millimeters), for example in the range of about 1 to 5 mm, for example in the range of about 2 to 3 mm, for example about 2 mm, for example about 2.5 mm, or for example about 3 mm. There may be no hard limit to the size of the protrusion. In the design shown in the drawings, the protrusion may be the same height as the foot protrusion from the commonly used implementation, which may be 3 mm tall including the rubber foot part—a 1.5 mm offset of the D-part nominal wall. The foot offset may be 2.75 mm, which may allow the heat pipe to be placed even lower than what is shown in the figures—the overall height of the foot with rubber pad may be 4.8 mm. The shape of the protrusion may be anything, though the shape may most likely be driven by the manufacturing process of the bottom housing (D-part). The parts shown may be formed sheet metal, so some transition from the nominal wall to the full depth of the protrusion may be desired (the protrusion may not be able to have vertical walls). However, the D-part may also be an injection molded plastic, or cast metal part, and thus the protrusion may have nearly vertical walls, and may hug the heat pipe more closely.

According to various embodiments, a part of a housing for a computer system may be provided. The part may include a protrusion configured to hold one end of a heat pipe of the computer system.

According to various embodiments, the protrusion may include or may be or may be included in a part of a foot of the housing of the computer system.

According to various embodiments, the foot may provide a distance of a main surface of a lower part of the housing and a surface on which the computer system stands.

According to various embodiments, another end of the heat pipe may be configured to be connected to a heat generating device.

According to various embodiments, the heat generating device may include or may be or may be included in a central processing unit and/or a graphics processing unit.

According to various embodiments, the one end of the heat pipe may be connected to a heat exchanger.

According to various embodiments, the heat exchanger may include or may be a plurality of fins. The fins may have an at least generally rectangular shape.

According to various embodiments, a blower may be configured to blow air through the heat exchanger.

According to various embodiments, the dimensions of the protrusion may be in the range of about 1 to 6 mm (millimeters), for example in the range of about 1 to 5 mm, for example in the range of about 2 to 3 mm, for example about 2 mm, for example about 2.5 mm, or for example about 3 mm. There may be no hard limit to the size of the protrusion. In the design shown in the drawings, the protrusion may be the same height as the foot protrusion from the commonly used implementation, which may be 3 mm tall including the rubber foot part—a 1.5 mm offset of the D-part nominal wall. The foot offset may be 2.75 mm, which may allow the heat pipe to be placed even lower than what is shown in the figures—the overall height of the foot with rubber pad may be 4.8 mm. The shape of the protrusion may be anything, though the shape may most likely be driven by the manufacturing process of the bottom housing (D-part). The parts shown may be formed sheet metal, so some transition from the nominal wall to the full depth of the protrusion may be desired (the protrusion may not be able to have vertical walls). However, the D-part may also be an injection molded plastic, or cast metal part, and thus the protrusion may have nearly vertical walls, and may hug the heat pipe more closely.

According to various embodiments, the part may be a D-part. It will be understood that for the housing of a notebook computers, parts may be labeled according to the letters of the alphabet. For example, the backside housing of the display may be an A-part, the side of the housing exposing the screen may be a B-part, the lower part of the housing holding the keyboard may be a C-part, and the backside of the housing, for example including the feet of the notebook computer, may be a D-part.

According to various embodiments, a heat exchanger for connecting to a heat pipe may be provided. The heat exchanger may include a plurality of fins. The fins may have an at least generally rectangular shape.

According to various embodiments, the heat exchanger may be configured to be connected to one end of a heat pipe, wherein the one end of the heat pipe may be provided in a protrusion of a housing of a computer system.

According to various embodiments, the protrusion may include or may be or may be included in a part of a foot of the housing of the computer system.

According to various embodiments, the foot may provide a distance of a main surface of a lower part of the housing and a surface on which the computer system stands.

According to various embodiments, another end of the heat pipe may be configured to be connected to a heat generating device.

According to various embodiments, the heat generating device may include or may be or may be included in a central processing unit and/or a graphics processing unit.

According to various embodiments, a blower may be configured to blow air through the heat exchanger.

According to various embodiments, the dimensions of the protrusion may be in the range of about 1 to 6 mm (millimeters), for example in the range of about 1 to 5 mm, for example in the range of about 2 to 3 mm, for example about 2 mm, for example about 2.5 mm, or for example about 3 mm. There may be no hard limit to the size of the protrusion. In the design shown in the drawings, the protrusion may be the same height as the foot protrusion from the commonly used implementation, which may be 3 mm tall including the rubber foot part—a 1.5 mm offset of the D-part nominal wall. The foot offset may be 2.75 mm, which may allow the heat pipe to be placed even lower than what is shown in the figures—the overall height of the foot with rubber pad may be 4.8 mm. The shape of the protrusion may be anything, though the shape may most likely be driven by the manufacturing process of the bottom housing (D-part). The parts shown may be formed sheet metal, so some transition from the nominal wall to the full depth of the protrusion may be desired (the protrusion may not be able to have vertical walls). However, the D-part may also be an injection molded plastic, or cast metal part, and thus the protrusion may have nearly vertical walls, and may hug the heat pipe more closely.

According to various embodiments, the dimension of the fins may be about 5 to 50 mm (millimeters) tall (for example about 10 to 30 mm tall, for example about 5 to 20 mm tall, for example about 8.6 mm tall, for example about 10 mm tall, for example about 20 mm tall, or for example about 30 mm tall), and about 5 to 50 mm wide (for example about 10 to 40 mm wide, for example about 10 to 30 mm wide, for example about 10 mm wide, for example about 20 mm wide, for example about 24 mm wide, or for example about 30 mm wide). The dimensions may depend on the cooling requirements and the space available. It will be understood that "tall" may describe the z-height, and that "wide" may describe the length.

Figure 7:
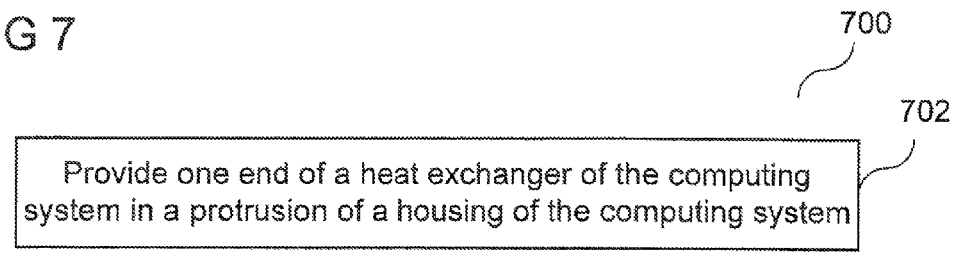
FIG. 7 shows flow diagram illustrating a method for assembling parts of a computer system in accordance with an embodiment.

FIG. 7 shows flow diagram 700 illustrating a method for assembling parts of a computer system in accordance with an embodiment. In 702, one end of a heat exchanger of the computer system may be provided in a protrusion of a housing of the computer system.

According to various embodiments, the protrusion may include or may be or may be included in a part of a foot of the housing of the computer system.

According to various embodiments, the foot may provide a distance of a main surface of a lower part of the housing and a surface on which the computer system stands.

According to various embodiments, the method may further include connecting the one end of the heat pipe to a heat exchanger.

According to various embodiments, the method may further include connecting another end of the heat pipe to a heat generating device.

According to various embodiments, the heat generating device may include or may be or may be included in a central processing unit and/or a graphics processing unit.

According to various embodiments, the heat exchanger may include or may be a plurality of fins. The fins may have an at least generally rectangular shape.

According to various embodiments, the method may further include providing a blower configured to blow air through the heat exchanger.

According to various embodiments, the dimensions of the protrusion may be in the range of about 1 to 6 mm (millimeters), for example in the range of about 1 to 5 mm, for example in the range of about 2 to 3 mm, for example about 2 mm, for example about 2.5 mm, or for example about 3 mm. There may be no hard limit to the size of the protrusion. In the design shown in the drawings, the protrusion may be the same height as the foot protrusion from the commonly used implementation, which may be 3 mm tall including the rubber foot part—a 1.5 mm offset of the D-part nominal wall. The foot offset may be 2.75 mm, which may allow the heat pipe to be placed even lower than what is shown in the figures—the overall height of the foot with rubber pad may be 4.8 mm. The shape of the protrusion may be anything, though the shape may most likely be driven by the manufacturing process of the bottom housing (D-part). The parts shown may be formed sheet metal, so some transition from the nominal wall to the full depth of the protrusion may be desired (the protrusion may not be able to have vertical walls). However, the D-part may also be an injection molded plastic, or cast metal part, and thus the protrusion may have nearly vertical walls, and may hug the heat pipe more closely.

According to various embodiments, the area open for air to flow through the heat exchanger may be increased by having the heat pipe jog away from the heat exchanger and live in a space that is locally offset from the nominal wall of the computer. This offset area may be hidden so as to not be objectionable by making it also serve the function of a foot on which the computer rests.

Figure 8:
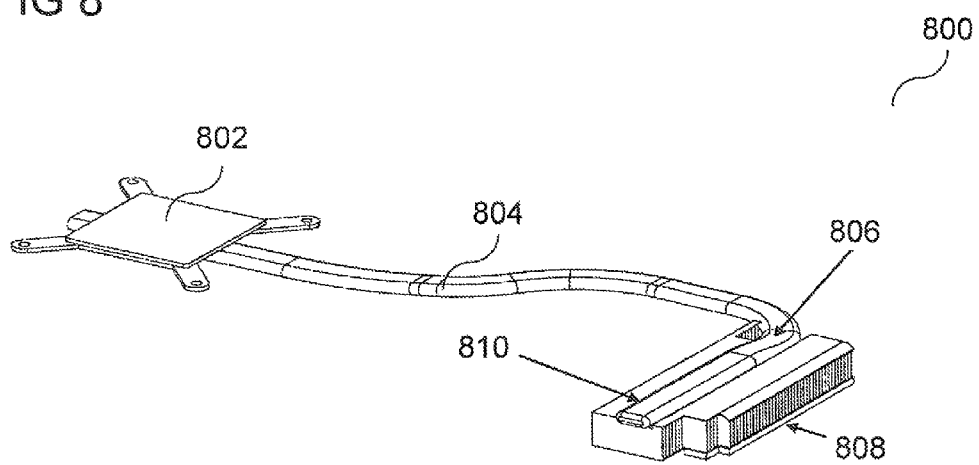
FIG. 8 shows a heat pipe assembly in accordance with an embodiment.

FIG. 8 shows a heat pipe assembly 800 in accordance with an embodiment. In the heat pipe assembly 800, a heat exchanger 808 with most of a heat pipe 804 (or most of an end of a heat pipe) moved outside the fin area is shown. Another end of the heat pipe may be coupled to a heat generating device 802, for example using a heat transfer plate or heat transfer paste. The heat pipe 804 may have a bend 806 added to move the heat pipe outside the heat exchanger 808. Like indicated by arrow 810, most of the heat pipe 804 (or the one end of the heat pipe 804) may sit on the top of the fins of the heat exchanger 808 rather than being buried inside them. This may be provided for example by the fins of the heat exchanger 808 having an at least generally rectangular shape.

Figure 9:
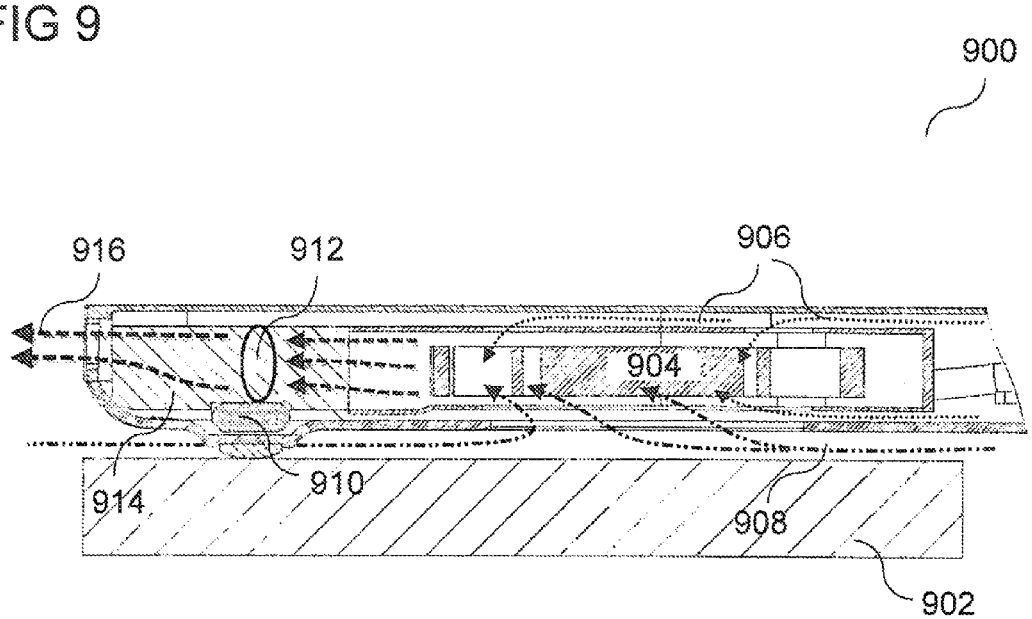
FIG. 9 shows a cross-sectional view of a cooling system in accordance with an embodiment.

FIG. 9 shows a cross-sectional view 900 of a cooling system in accordance with an embodiment. The cross-section through the cooling system according to various embodiments shows the reduced flow restriction and increased fin area afforded by allowing a heat pipe 910 to occupy the foot protrusion. The computer system (for example a notebook computer) including the cooling system may stand on a desktop 902. Cool air may be drawn in by a blower 904 (for example including fan blades) through vents in the bottom housing, like indicated by dashed-and-dotted arrows 908. Warm air may be drawn by the blower 904 from inside, like indicated by dotted arrows 906. The housing may cool components that are not attached to the heat pipe. The heat pipe 910 may now sit in a cavity created by a long foot on the bottom housing. This may increase the open area through the heat exchanger (or heat exchanger fins 914). As indicated by an ellipsoid 912, reduced flow restriction may occur. The heat exchanger now may have a larger area for freely flowing air. This may increase the efficiency of the cooling system by reducing pressure drop through the heat exchanger (HTX), increasing air flow velocity, and exposing a larger fin surface area to this increased flow. Like indicated by dashed arrows 916, the heat exchanger may transfer heat from the fins 914 to the air. The hot air may then be expelled from the system.

Figure 10:
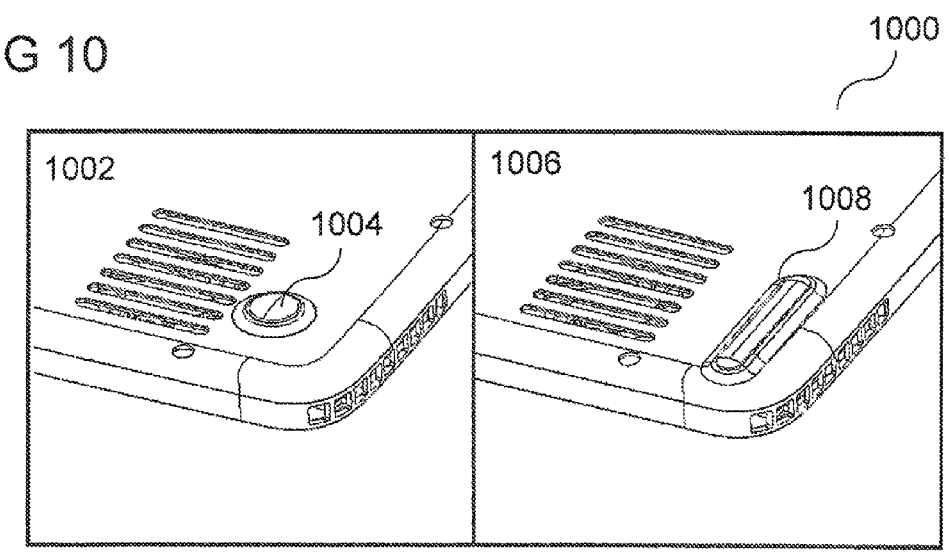
FIG. 10 shows a comparison of a foot of a housing of a commonly used computer system and a computer system in accordance with an embodiment.

According to various embodiments, to make room for the heat pipe to occupy the foot protrusion, the foot protrusion may be elongated as shown in FIG. 10.

FIG. 10 shows a comparison 1000 of a foot of a housing of a commonly used computer system and of a computer system in accordance with an embodiment. In 1002, a commonly used computer system is shown, in which a localized foot protrusion 1004 may be provided. In 1006, a computer system according to various embodiments is shown, in which an elongated foot protrusion 1008 may accommodate the heat pipe.

Figure 11:
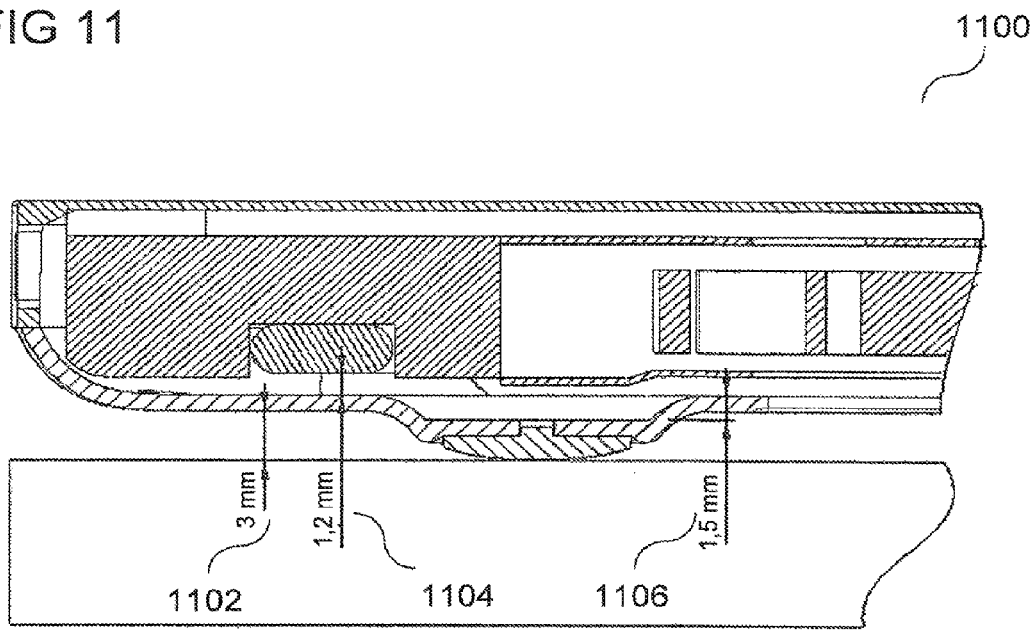
FIG. 11 shows a cross-section of a commonly used computer system.

FIG. 11 shows a cross-section 1100 of a commonly used computer system. As indicated in 1102, in the commonly used implementation, the foot may be 3 mm tall in total, and, as indicated in 1106, the foot may be offset by 1.5 mm in the D-part. Furthermore, in the commonly used computer system, as indicated in 1104, the heat pipe may be offset by 1.2 mm with respect to the D-part.

Figure 12:
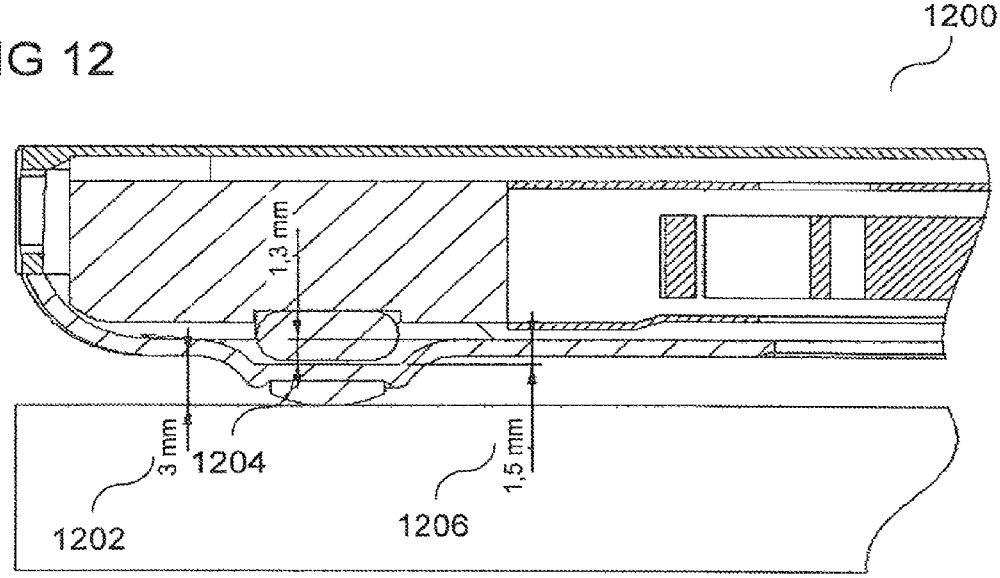
FIG. 12 shows a cross-section of a computer system in accordance with an embodiment.

FIG. 12 shows a cross-section 1200 of a computer system in accordance with an embodiment. In the computer system in accordance with an embodiment, like indicated in 1202, the foot may also be 3 mm tall in total, and, as indicated in 1206, the foot may also be offset by 1.5 mm in the D-part. However, in the computer system according to various embodiments, as indicated in 1204, the heat pipe may be lowered by 1.3 mm compared to the D-part different from the foot. Thus, in total, the heat pipe may be lower in the computer system according to an embodiment compared to a commonly used computer system by 2.5 mm (1.2 mm+1.3 mm).

According to various embodiments, the efficiency of a cooling system may be improved by increasing heat exchanger fin surface area and reducing the air flow restriction through the heat exchanger caused by the heat pipe without any increase in the apparent thickness of the computer.

According to various embodiments, the limitations of notebook computer design may be eased by allowing more heat to be removed from the system without increasing the apparent thickness of the computer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A computer system comprising:
   a housing with a protrusion,
   wherein the protrusion has at least substantially vertical walls extending out of the housing to form a foot of the housing;
   a heat generating device;
   a heat exchanger;
   a blower configured to provide an air flow through the heat exchanger; and
   a heat pipe configured to transfer heat from a first end of the heat pipe to a second end of the heat pipe;
   wherein the first end of the heat pipe is coupled to the heat generating device;
   wherein the second end of the heat pipe is coupled to the heat exchanger;
   wherein the second end of the heat pipe is arranged in the foot such that the air flow through the heat exchanger is free from obstruction from the second end of the heat pipe;
   wherein the at least substantially vertical walls hug the second end of the heat pipe.

2. The computer system of claim 1,
   wherein the heat generating device comprises at least one of a central processing unit and a graphics processing unit.

3. The computer system of claim 1,
   wherein the heat exchanger comprises a plurality of fins;
   wherein the fins have an at least generally rectangular shape.

4. A part of a housing for a computer system, the part comprising:
   a blower configured to provide an air flow through a heat exchanger;
   a protrusion having at least substantially vertical walls extending out of the housing to form a foot of the housing; and
   a heat pipe having one end arranged in the foot such that the air flow through the heat exchanger is free from obstruction from the one end of the heat pipe,
   wherein the at least substantially vertical walls hug the one end of the heat pipe.

5. The part of claim 4,
   wherein another end of the heat pipe is configured to be connected to a heat generating device.

6. The part of claim 5,
   wherein the heat generating device comprises at least one of a central processing unit and a graphics processing unit.

7. The part of claim 4,
   wherein the one end of the heat pipe is connected to the heat exchanger.

8. The part of claim 7,
   wherein the heat exchanger comprises a plurality of fins;
   wherein the fins have an at least generally rectangular shape.

9. The part of claim 4,
   wherein the part is a bottom housing of a notebook computer.

10. A method for assembling parts of a computer system, the method comprising:
    providing a blower configured to provide an air flow through a heat exchanger;
    providing a protrusion in a housing of the computer system, wherein the protrusion has at least substantially vertical walls extending out of the housing to form a foot of the housing; and
    providing one end of a heat pipe of the computer system in the foot such that the heat flow through the heat exchanger is free from obstruction from the one end of the heat pipe,
    wherein the at least substantially vertical walls hug the second end of the heat pipe.

11. The method of claim 10, further comprising:
    connecting the one end of the heat pipe to the heat exchanger.

12. The method of claim 11, further comprising:
    connecting another end of the heat pipe to a heat generating device.

13. The method of claim 12,
    wherein the heat generating device comprises at least one of a central processing unit and a graphics processing unit.

14. The method of claim 10,
    wherein the heat exchanger comprises a plurality of fins;
    wherein the fins have an at least generally rectangular shape.

* * * * *